United States Patent
Xiao et al.

(10) Patent No.: US 7,938,666 B2
(45) Date of Patent: May 10, 2011

(54) SOCKET CONNECTOR WITH A CAM

(75) Inventors: Yu-Bao Xiao, Shenzhen (CN); Wen He, Shenzhen (CN)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/854,205

(22) Filed: Aug. 11, 2010

(65) Prior Publication Data

US 2011/0039437 A1 Feb. 17, 2011

(30) Foreign Application Priority Data

Aug. 12, 2009 (CN) .......................... 2009 2 0307863

(51) Int. Cl.
H01R 13/625 (2006.01)
(52) U.S. Cl. ...................................................... 439/342
(58) Field of Classification Search .................... 439/342
See application file for complete search history.

(56) References Cited

U.S. PATENT DOCUMENTS

| | | | | |
|---|---|---|---|---|
| 6,249,953 | B1 * | 6/2001 | Aydelott | 29/464 |
| 7,070,347 | B2 * | 7/2006 | Carriere et al. | 400/221 |
| 7,607,932 | B1 * | 10/2009 | Polnyl | 439/342 |
| 2001/0018286 | A1 * | 8/2001 | Mizumura | 439/342 |
| 2003/0228785 | A1 * | 12/2003 | Okita et al. | 439/342 |
| 2004/0087199 | A1 * | 5/2004 | Tran et al. | 439/342 |
| 2005/0186827 | A1 * | 8/2005 | He et al. | 439/342 |
| 2005/0215102 | A1 * | 9/2005 | Yu et al. | 439/342 |
| 2010/0029121 | A1 * | 2/2010 | Szu | 439/342 |

FOREIGN PATENT DOCUMENTS

| | | |
|---|---|---|
| CN | 2520042 | 11/2002 |
| CN | 2531533 | 1/2003 |
| CN | 2704126 | 6/2005 |
| TW | I290397 | 5/2007 |

* cited by examiner

*Primary Examiner* — Gary F. Paumen
(74) *Attorney, Agent, or Firm* — Andrew C. Cheng; Wei Te Chung; Ming Chieh Chang

(57) ABSTRACT

A socket connector (100) includes an insulative housing (1), a plurality of contacts received in the insulative housing, a cover (2) attached to the upper side of the insulative housing and a cam (3). The insulative housing defines an upper side and a lower side. The insulative housing has a first aperture (13) which extends through the upper and lower sides. The cover defines an upper surface and a lower surface and has a second aperture (23) extending through the upper and lower surfaces. The second aperture aligns with the first aperture in a vertical direction. The cam has a first cam portion (31) and a second cam portion (32) separately pre-formed and jointly combined and correspondingly received in the first and second apertures. The second cam portion is operable to urge the insulative cover relative to the insulative housing along a front-to-rear direction.

15 Claims, 4 Drawing Sheets

SOCKET CONNECTOR WITH A CAM

BACKGROUND OF THE INVENTION

1. Field of the Invention

The present invention relates generally to a socket connector, and more particularly to a socket connector for receiving a CPU (Central Processing Unit), and having a cam structure which is easily manufactured.

2. Description of Related Arts

TW Pat. No. I290397 issued on Nov. 21, 2007 and having the same assignee as the present patent application discloses a traditional socket connector. The socket connector comprises an insulative housing, an insulative cover slidably mounted on the insulative housing, and a plurality of terminals received in the corresponding passageways defined through the insulative housing for electrically connecting pin legs of a CPU (Central Processing Unit) with a printed circuit board (PCB), and a metallic cam engaged between the insulative housing and the cover for actuating the cover's movement on the insulative housing between a first position and a second position. The pin legs of the CPU are inserted into the corresponding passageways of the insulative housing but not engage with the terminals when the cover is located at the first position. The pin legs of the CPU move along with the cover and engage with the terminals when the cover moves to the second position. The cam comprises an upper disk, a lower disk and a lower cam block. The upper disk is coaxial with the lower disk and has a diameter larger than the lower disk. The cam block is formed beneath the lower disk and comprises a riveting end coaxial with the cam block at a lower end thereof A rotational axis of the cam block is offset from a rotational axis of the lower disk for biasing the cover's movement on the insulative housing. The cam is metallically, integrally formed and has a large size because of stepped arrangement of the upper disk, the lower disk and the lower cam block thereof A precision of the cam is hard to be controlled. In manufacturing, it usually makes material hard to flow therethrough, and so it needs a plurality of punches to meet precision of the demanded cam since the cam commonly determines corporation between the cover and the insulative housing. During the plurality of punches, useful life of the molds used therein is reduced.

Hence, a socket connector having an improved came which is easily manufactured is desired to overcome the aforementioned disadvantage of the prior art.

SUMMARY OF THE INVENTION

Accordingly, an object of the present invention is to provide a socket connector having an improved came which is easily manufactured.

To achieve the above object, A socket connector includes an insulative housing, a plurality of contacts received in the insulative housing, a cover attached to the upper side of the insulative housing and a cam. The insulative housing defines an upper side and a lower side. The insulative housing has a first aperture which extends through the upper and lower sides. The cover defines an upper surface and a lower surface and has a second aperture extending through the upper and lower surfaces. The second aperture aligns with the first aperture in a vertical direction. The cam has a first cam portion and a second cam portion separately pre-formed and jointly combined and correspondingly received in the first and second apertures. The second cam portion is operable to urge the insulative cover relative to the insulative housing along a front-to-rear direction.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Referring to FIGS. 1-4, a socket connector 100 of the present invention, used for receiving a CPU (Central Processing Unit, not shown), comprises an insulative housing 1 defining a plurality of passageways, a plurality of contacts (not shown) received in the insulative housing 1, an insulative cover 2 locating upon the insulative housing 1, and a came 3 actuating the insulative cover 2 to move on the insulative housing 1 along a front-to-rear direction between a first position at which pin legs of the CPU are inserted into the passageways of the insulative housing 1 with zero insertion force and a second position at which the pin legs of the CPU are engaged with the contacts for connection.

Figure 1:
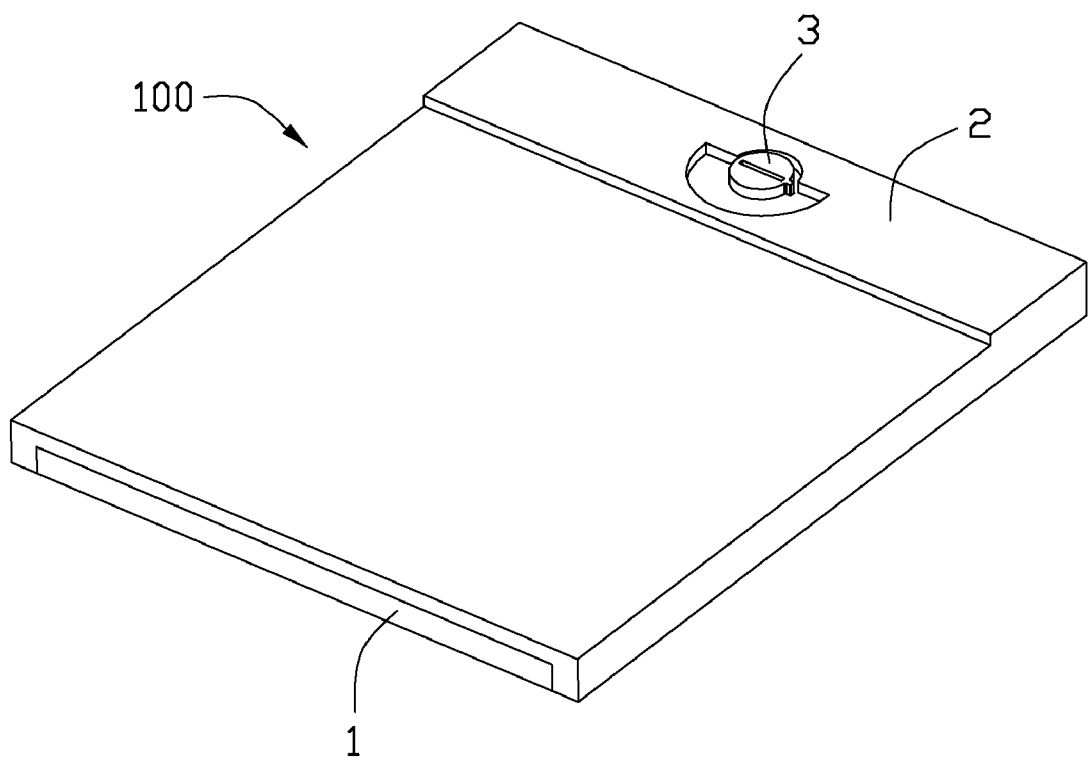
FIG. 1 is a perspective, assembled view of a socket connector constructed in accordance with the present invention.
Figure 2:
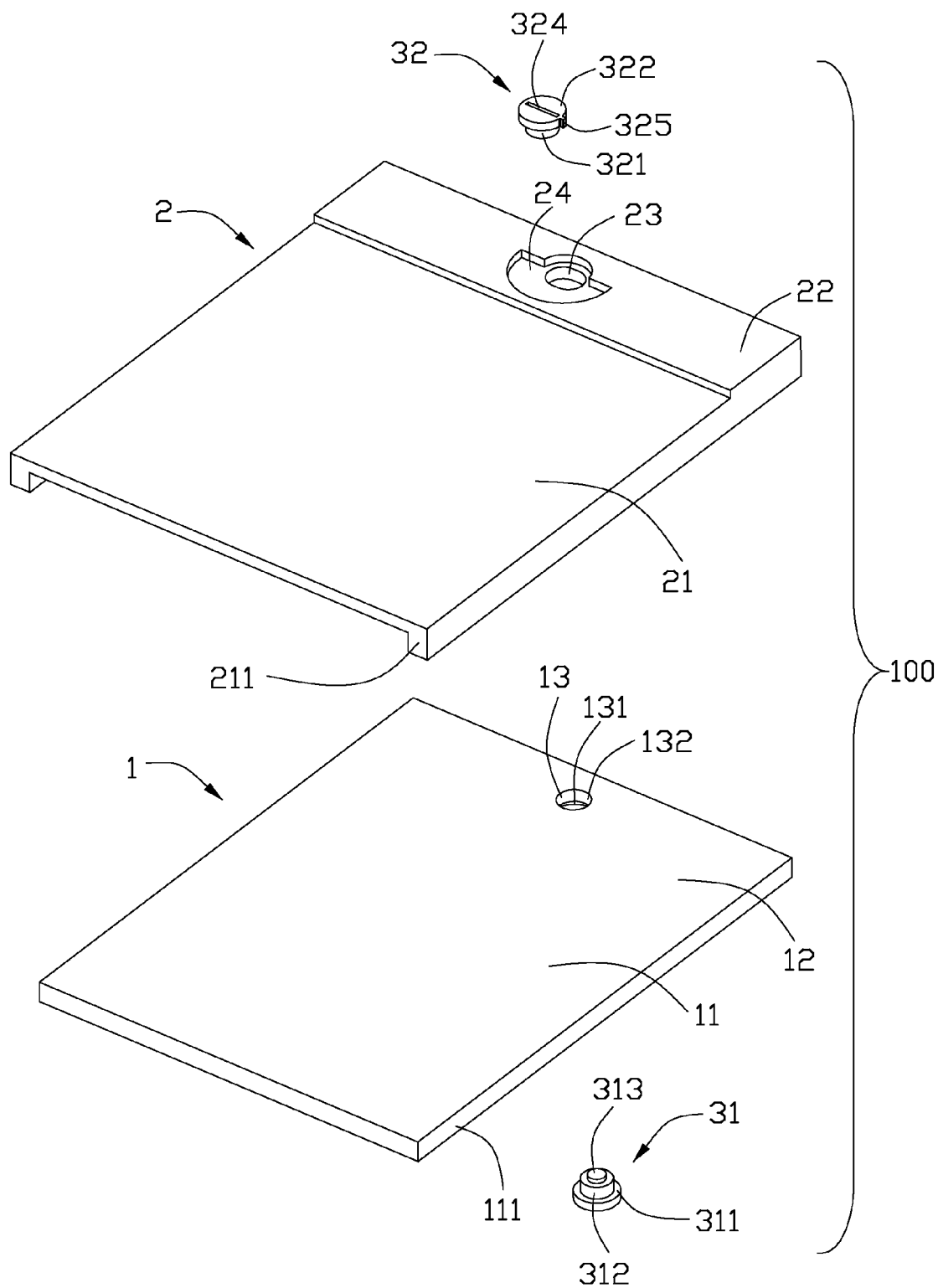
FIG. 2 is a perspective, exploded view of the socket connector.
Figure 3:
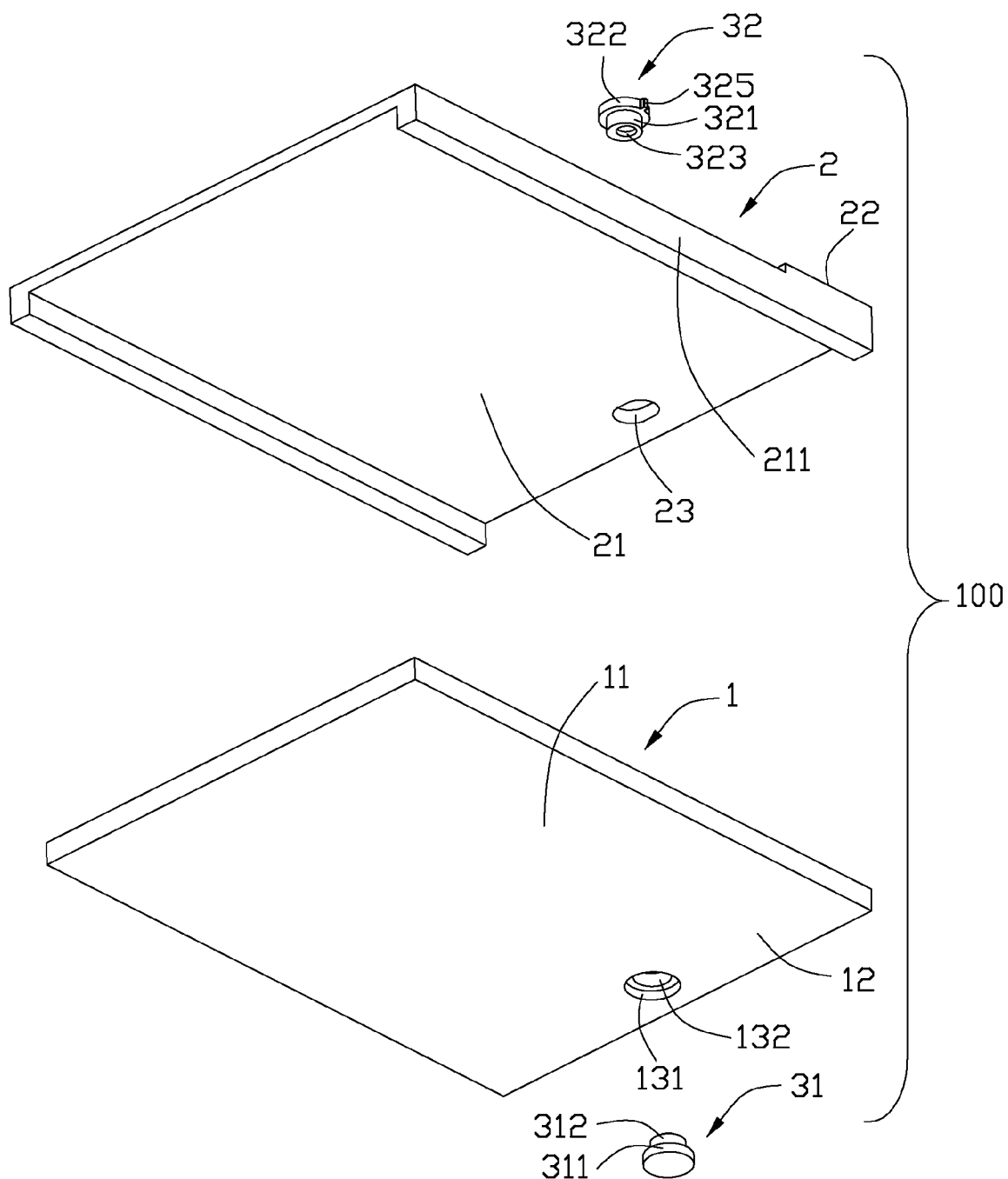
FIG. 3 is another perspective, exploded view of the socket connector.

Referring to FIGS. 2 and 3, the insulative housing 1 forms a first main portion 11 and a first flat portion 12 extending rearwards from the first main portion 11. The first main portion 11 defines the passageways for the contacts. The first main portion 11 defines a pair of lateral walls 111 at two lateral sides thereof. The first flat portion 12 defines a first aperture 13 extending therethrough for receiving a lower end of the cam 3. The first aperture 13 has a lower part 131 and an upper part 132. The first aperture 13 is stepped structured and the upper part 132 has a diameter smaller than that of the lower part 131.

Referring to FIGS. 2 and 3, the insulative cover 2 is arranged upon the insulative housing 1 and comprises a second main portion 21 and a second flat portion 22 extending rearwards from the second main portion 21, which has a larger thickness compared to the second main portion 21. The second main portion 21 forms a pair of vertical walls 211 extending downwardly from the edges of the second main portion 21. The vertical walls 211 encircle periphery of the lateral walls 111 for assembling the insulative cover 2 onto the insulative housing 1 and making sure that the insulative cover 2 capable of moving on the insulative housing 1 in the front-to-rear direction. The second flat portion 22 defines a second aperture 23 aligning with the first aperture 13 in a vertical direction for receiving an upper end of the cam 3. The second aperture 23 is elongated in a transverse direction relative to the front-to-rear direction, i.e. the second aperture 23 has a diameter in the transverse direction larger than that of the front-to-rear direction, and therefore, the insulative cover 2 is actuated by the cam 3 to move on the insulative housing 1 along the front-to-rear direction only. The second main portion 21 defines a plurality of openings (not shown) corresponding to the passageways of the first main portion 11. Pin legs of the CPU extend through the openings and extend into the passageways without insertion force. The insulative cover 2 moves to the second position and the pin legs of the CPU are engaged with the contacts, which are well known to persons skilled in the art and it is not described in detail herein. Usually, symbols such as "lock" and "unlock" are labeled on the insulative cover 2. The second flat portion 22 has a recess portion 24 around the first aperture 23.

Referring to FIGS. 1-4, the cam 3 has two separated parts commonly called as a first cam portion 31 being inserted in the first aperture 13 of the insulative housing 1 and a second cam portion 32 being inserted in the second aperture 23 of the insulative cover 2. The first cam portion 31 is inserted into the first aperture 13 from a lower side of the insulative housing 1 while the second cam portion 32 is inserted into the second aperture 23 from an upper side of the insulative cover 2. The first cam portion 31 has a first disk 311, a second disk 312, and an axle 313 from the lower to the upper in turn. The first disk 311, the second disk 312, and the axle 313 each latter has a diameter smaller than the former. The second cam portion 32 has a third disk 321 and a fourth disk 322 from the lower to the upper and the latter has a diameter larger than the former. The third disk 321 defines a cutout 323. The cutout 323 receives and interferentially engages the axle 313 and therefore, the second cam portion 32 rotates in the second aperture 23 due to the rotation of the first cam portion 31. The first disk 311 and the second disk 312 are correspondingly, freely received in the lower part 131 and the upper part 132 of the first aperture 13, making sure that the first cam portion 31 is driven by the second cam portion 32 to rotate in the first aperture 13. The third disk 321 is received in the second aperture 23 and the fourth disk 322 is exposed in the recessed portion 24 of the second flat portion 22. The fourth disk 322 defines a slit 324 in the preferred embodiment of the present invention, and a user operates a screwing instrument in the slit 324 to make the first cam portion 31 rotate around. Moreover, the fourth disk 322 forms a protrusion 325 extending therefrom for indicating whether the cam 3 is rotated to a right position or not. Usually, the protrusion 325 is rotated to the "lock" position, the right position is arrived, which indicates the user that no excess force is need for the cam 3.

Figure 4:
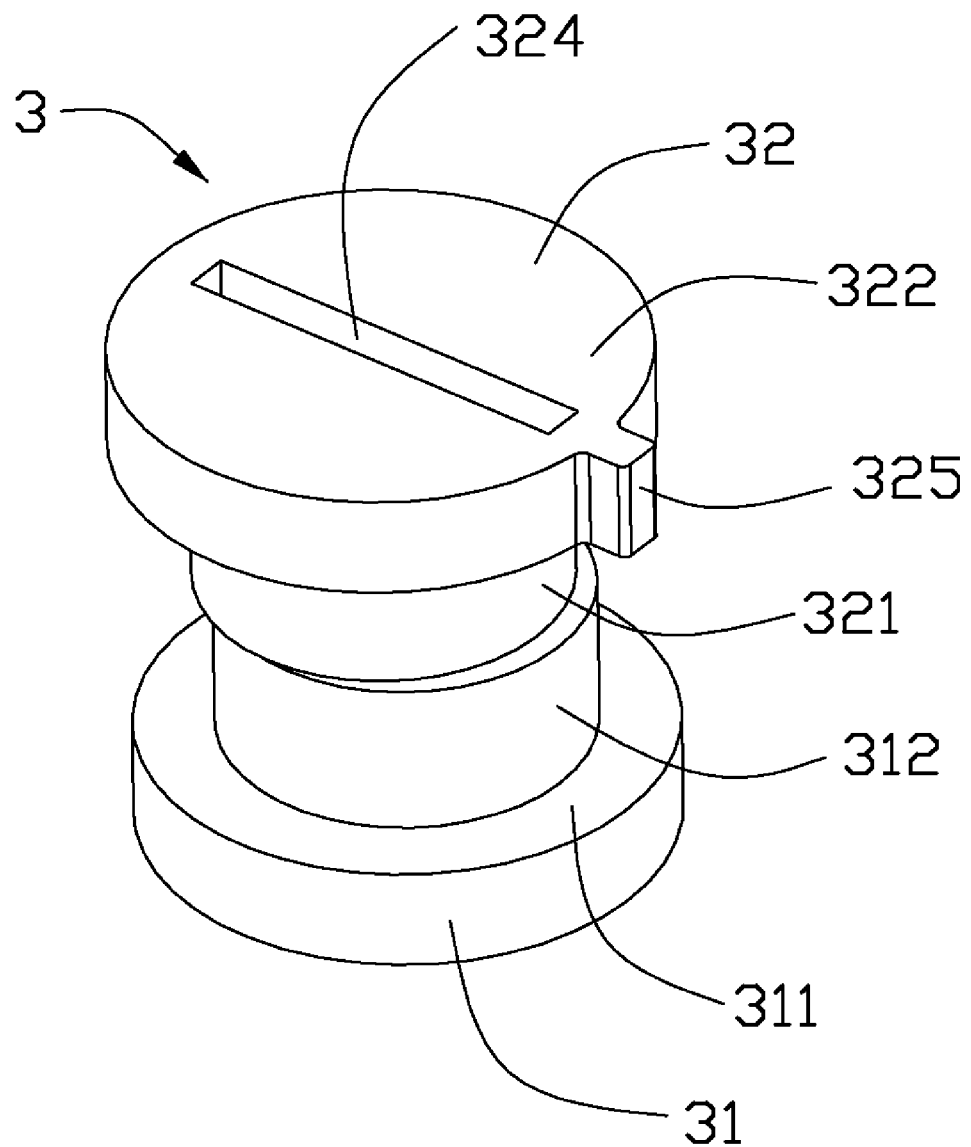
FIG. 4 is a perspective view of the cam.

Referring to FIGS. 2-4, the first disk 311, the second disk 312, and the axle 313 of the first cam portion 31 are coaxial with each other. The first cam portion 31 defines a first rotational axial line. The third disk 321 and the fourth disk 322 are coaxial with each other too, but the cutout 323 is offset from a second rotational axial line of the second cam portion 32 which is defined by the third disk 321 and the fourth disk 322. When the first cam portion 31 and the second cam portion 32 are engage with each other by the cooperation between the axle 313 and the cutout 323, the first rotation axial line of the first cam portion 31 and the second rotational axial line of the second cam portion 32 are offset to each other. Therefore, the second cam portion 32 of the cam 3 convexly rotates in the second, elongated aperture 23, and the insulative cover 2 is biased to move on the insulative housing 1 along the front-to-rear direction.

In the present invention, because the cam 3 has two separated cam portions 31, 32, each cam portion 31, 32 can be more easily and precisely manufactured. Useful life of the molds used is also increased because designs of the molds are simplified.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A socket connector comprising:
    an insulative housing defining an upper side and a lower side, the insulative housing having a first aperture extending through the upper and lower sides;
    a plurality of contacts received in the insulative housing;
    a cover attached to the upper side of the insulative housing, the cover defining an upper surface and a lower surface and having a second aperture extending through the upper and lower surfaces, the second aperture aligning with the first aperture in a vertical direction; and
    a cam having a first cam portion and a second cam portion separately pre-formed and jointly combined and correspondingly received in the first and second apertures, the second cam portion being operable to urge the insulative cover relative to the insulative housing along a front-to-rear direction.

2. The socket connector as claimed in claim 1, wherein the second aperture is elongated in a transverse direction relative to the front-to-rear direction.

3. The socket connector as claimed in claim 2, wherein the first cam portion comprises concentric lower first disk and upper second disk and an axle.

4. The socket connector as claimed in claim 3, wherein the second disk has a diameter smaller than that of the first disk and the axle protrudes from the second disk and has a diameter smaller than that of the second disk.

5. The socket connector as claimed in claim 3, wherein the second cam portion comprises concentric lower third disk and upper fourth.

6. The socket connector as claimed in claim 5, wherein the third disk has a diameter smaller than that of the fourth disk.

7. The socket connector as claimed in claim 5, wherein the second cam portion has a cutout at the third disk for interferingly receiving the axle.

8. The socket connector as claimed in claim 1, wherein the first aperture has a lower part and an upper part of different diameters for respectively receiving the first disk and the second disk of the first cam portion.

9. A socket for connecting an electronic package to a printed circuit board, comprising:
    an insulative base including a head portion and a contact receiving portion;
    an insulative cover mounted upon the base and moveable relative to the base in a front-to-back direction, said cover including a head section and a pin receiving section;
    a plurality of contacts disposed in the contact receiving portion for connecting a plurality pins extending downwardly through the pin receiving section; and
    a cam including an upper cam portion and a lower cam portion respectively disposed in the cover and the base and assembled to each other, said upper cam portion including a round upper disc and an upper engagement section located below the upper disc and being eccentric relative to the round disc, and the lower cam portion including a lower disc and a lower engagement section located above the lower disc constantly engaged with the upper engagement section; wherein the base includes a hole snugly retaining the lower disc therein without moving while the cover includes a capsular hole snugly receiving the upper disc therein in a front-to-back direction while allowing the upper disc to move in a lateral direction therein when said upper cam portion is rotated relative to the lower cam portion so as to urge the cover to move in said front-to-back direction.

10. The socket as claimed in claim 9, wherein said upper engagement section is a tube and said lower engagement section is a post received in said tube.

11. The socket as claimed in claim 10, wherein said post extends upwardly above an upper face of the base and further above a bottom face of the cover.

12. The socket as claimed in claim 9, wherein said lower engagement section is locate at a center of the lower disc.

13. The socket as claimed in claim 9, wherein said base defines a sink type hole to receive said lower disc therein.

14. The socket as claimed in claim 9, wherein said cover defines a recessed portion above the capsular hole to receive an operation disc above the upper disc.

15. The socket as claimed in claim 14, wherein the upper engagement section is located at a center of said operation disc.

* * * * *